United States Patent
Du

(10) Patent No.: US 6,898,534 B2
(45) Date of Patent: May 24, 2005

(54) DC MEASUREMENT METHOD AND SYSTEM USING SIGMA-DELTA MODULATION PATTERN

(75) Inventor: Tan Du, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 76 days.

(21) Appl. No.: 10/429,570

(22) Filed: May 5, 2003

(65) Prior Publication Data

US 2004/0222799 A1 Nov. 11, 2004

(51) Int. Cl.[7] .............................................. G06F 19/00
(52) U.S. Cl. ...................................... 702/64; 324/522
(58) Field of Search .............................. 702/64, 57–58, 702/75, 182–185, 189, 191; 324/520, 522, 76.39, 76.44, 76.48

(56) References Cited

U.S. PATENT DOCUMENTS

| | | | |
|---|---|---|---|
| 5,030,952 A | * | 7/1991 | Ledzius et al. .............. 341/143 |
| 5,239,494 A | * | 8/1993 | Golbeck ......................... 708/3 |
| 6,101,864 A | * | 8/2000 | Abrams et al. ............... 73/1.01 |
| 6,462,689 B2 | * | 10/2002 | Wong et al. ................. 341/144 |
| 2004/0225465 A1 | * | 11/2004 | Pramanick et al. ......... 702/119 |

* cited by examiner

*Primary Examiner*—Edward Raymong
(74) *Attorney, Agent, or Firm*—Ronald O. Neerings; Wade James Brady, III; Frederick J. Telecky, Jr.

(57) ABSTRACT

Disclosed are methods, systems, and algorithms for accurately measuring a DC voltage signal ($V_{in}$) using a sigma-delta modulator (36). The preferred embodiments disclose determining a fundamental period ($T_p$) of the pattern noise cycle of sigma-delta modulator output at a given DC input ($V_{in}$), and mapping a one-to-one relationship to the ratio of $V_{in}$ to reference voltage ($V_{ref}$). Methods, systems, and algorithms according to the invention include the conversion of a DC input ($V_{in}$) into a digital bitstream that periodically provides low-resolution high-frequency digital words (D1) representative of the DC input ($V_{in}$). The low-resolution high-frequency words (D1) are in turn periodically converted into high-resolution low-frequency words (D2) representative of the DC input ($V_{in}$). A fundamental pattern noise frequency ($F_f$) of modulator at DC input ($V_{in}$) is determined, and a DC measurement result (D3) is output at intervals ($1/f_h$) equal to an integer multiple of the fundamental pattern noise cycle ($1/F_f$) by taking the sum of the high-resolution low-frequency words (D2) at such intervals ($1/f_h$). Embodiments of the invention are disclosed in which the measurements results (D3) have an error level less than or equal to a selected relative error level ($E_r$).

19 Claims, 2 Drawing Sheets

DC MEASUREMENT METHOD AND SYSTEM USING SIGMA-DELTA MODULATION PATTERN

TECHNICAL FIELD

The invention relates to measuring DC voltage or current using sigma-delta modulation. More particularly, the invention relates to methods and apparatus for accurately gauging the battery condition of portable electronic devices using sigma-delta modulator based measurements.

BACKGROUND OF THE INVENTION

Battery fuel gauges are in widespread use to monitor battery conditions in portable electronic devices. Since battery voltage declines as the battery is discharged, terminal voltage is often used as a proxy for the current, or charge capacity, remaining in the battery. The task of making DC measurements of battery capacity has many variations depending on the processing capabilities of the portable electronic devices and the acceptable cost of accurately monitoring battery condition for the particular device.

Sigma-delta modulators are sometimes used for DC measurement. For example, battery current may be sensed by monitoring the voltage through a resistor placed in a circuit for that purpose. The voltage through the sense resistor is modulated by a sigma-delta modulator in order to convert the input analog voltage signal into a digital bitstream. An example of such an arrangement 10 used in the arts is shown in FIG. 1. A sense resistor 12 is connected in the discharge loop of the battery 14. A bitstream from the sigma-delta modulator 16 is fed into an accumulator 18, or decimation filter, the output of which in turn is passed to a counter 20. The output 24 of the counter 20 is read periodically at a regular or irregular interval. The reading is the net cumulative result, giving an indication of the condition of the monitored battery 14.

It is known that a sigma-delta modulator used in DC measurement is subject to spurious noise, also called pattern noise or "idle tone" if its frequency falls into the audio frequency band. This noise is related to the non-white nature of quantization error of the modulator. When pattern noise is present, the accumulated value output by the accumulator may not precisely represent the DC input to the modulator. Since the accumulator-counter arrangement counts how much current has passed through the sense resistor, the frequency of the pattern noise relative to the accumulation time may have a significant impact on the accuracy of the battery condition measurement. Using the current state of the art, if the accumulation time happens to match the period of the pattern noise, a better result is obtained than if the accumulation time and pattern noise cycle are out of synch.

It is known in the arts to estimate the upper and lower bounds of the digital error present in the digital representation of an analog signal. This technique is sometimes used in an effort to reduce error in DC measurements. Such a technique leaves much to be desired, however in terms of measurement accuracy. It would be useful and desirable in the arts to increase the accuracy of DC current monitoring for battery fuel gauges. It would be particularly advantageous if methods, algorithms, and systems were made available for systematically reducing error based on the characteristics of the input signal to be measured.

SUMMARY OF THE INVENTION

In carrying out the principles of the present invention, in accordance with preferred embodiments thereof, methods, systems, and algorithms are provided for determining the fundamental period of the pattern noise cycle of modulator output and mapping a one-to-one relationship to the ratio between DC input and reference voltage of a Sigma Delta modulator loop for increased accuracy in DC measurement.

According to one aspect of the invention, a method of measuring DC voltage in a circuit includes a step for converting the DC voltage into a digital bitstream and periodically producing low-resolution high-frequency digital words representative of the DC voltage input. In a further step, the low-resolution high-frequency words are periodically converted into high-resolution low-frequency words representative of the DC voltage input. As an additional step, a fundamental pattern noise frequency of the modulator output at given DC input voltage to the modulator is determined. In a final step, a DC voltage measurement result is output from a counter at intervals equal to an integer multiple of the fundamental pattern noise frequency by taking the sum of the high-resolution low-frequency words at such intervals.

According to another aspect of the invention, a method of measuring DC voltage in a circuit includes a step of determining the fundamental pattern noise frequency using a technique including the selection of a relative error level, $E_r$; and the selection of a number of pattern cycles, $M_r$, such that the following condition is satisfied:

$$M_r \geq \frac{1}{E_r}. \quad \text{(Eq. 9)}$$

According to yet another aspect of the invention, a method of finding minimum waiting time $T_r$ for a targeted accuracy $E_r$ in DC voltage measurement is determined according to, $$T_r = M_r (\max T_p) = \frac{1}{E_r} \frac{\max N_p}{f_s}, \quad \text{(Eq. 10)}$$

where $f_s$ is the clock frequency of modulator, $N_p$ the pattern length in terms of number of clock cycles, and max $T_p$ the longest pattern cycle period.

According to yet another aspect of the invention, a system for measuring DC voltage in a circuit is described in which a sigma-delta modulator converts a DC voltage input into a high frequency digital bitstream. This bitstream is accumulated by an accumulator for conversion to high-resolution low-frequency words. A counter sums the high-resolution low-frequency words. A subcircuit of the system is used for determining a fundamental pattern noise frequency of the modulator bit stream and the sum from the counter is output, at a frequency equal to a multiple of the fundamental pattern noise frequency, to provide a DC voltage measurement result.

According to still other aspects of the invention, the subcircuit for determining a fundamental pattern noise frequency of the DC voltage may further include a DSP device, an ASIC device, or automated test equipment (ATE).

According to still other aspects of the invention, an algorithm for measuring DC voltage in a circuit includes machine-readable instructions for executing the conversion of the analog input signal into a digital bitstream and producing a high-resolution low-frequency representation of the analog input. In an intermediate operation, a fundamental pattern noise frequency of the modulator bit stream at a given analog input signal is determined. An output is produced, at a frequency equal to an integer multiple of the fundamental pattern noise frequency, providing a measurement result of the analog input signal.

According to another aspect of the invention, an algorithm for measuring DC voltage in a circuit has further instructions for accepting the selection of a relative error level, $E_r$, and for taking measurements for a number of pattern cycles, $M_r$, such that after $M_r$ cycles, the relative error is smaller than a predetermined limit:

$$M_r \geq \frac{1}{E_r}. \quad \text{(Eq. 9)}$$

According to yet another aspect of the invention, an algorithm is adapted to ensure that the DC measurement output is performed at or after a period described by:

$$T_r = \frac{1}{E_r} \frac{\max N_p}{f_s}. \quad \text{(Eq. 10)}$$

Preferred embodiments of the invention are described in which the multiple of the fundamental pattern noise frequency is selected for a target relative error of 15%, 10%, 5%, or less.

The invention provides technical advantages including but not limited to increased precision and accuracy in making voltage measurements in a DC circuit. The invention also provides the capability for pre-selecting an acceptable measurement error level and adapting the measurement parameters in order to ensure that the pre-selected error level is met. These and other features, advantages, and benefits of the present invention will become apparent to one of ordinary skill in the art upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the figures unless otherwise noted. Like numerals refer to like parts throughout the various figures. Descriptive and directional terms used in the written description such as upper, lower, left, right, etc., refer to the drawings themselves as laid out on the paper and not to physical limitations of the invention unless specifically noted. The drawings are not to scale, and some features of embodiments shown and discussed are simplified or exaggerated for illustrating the principles, features, and advantages of the invention.

DETAILED DESCRIPTION OF PREFERRED EMBODIMENTS

Figure 1:
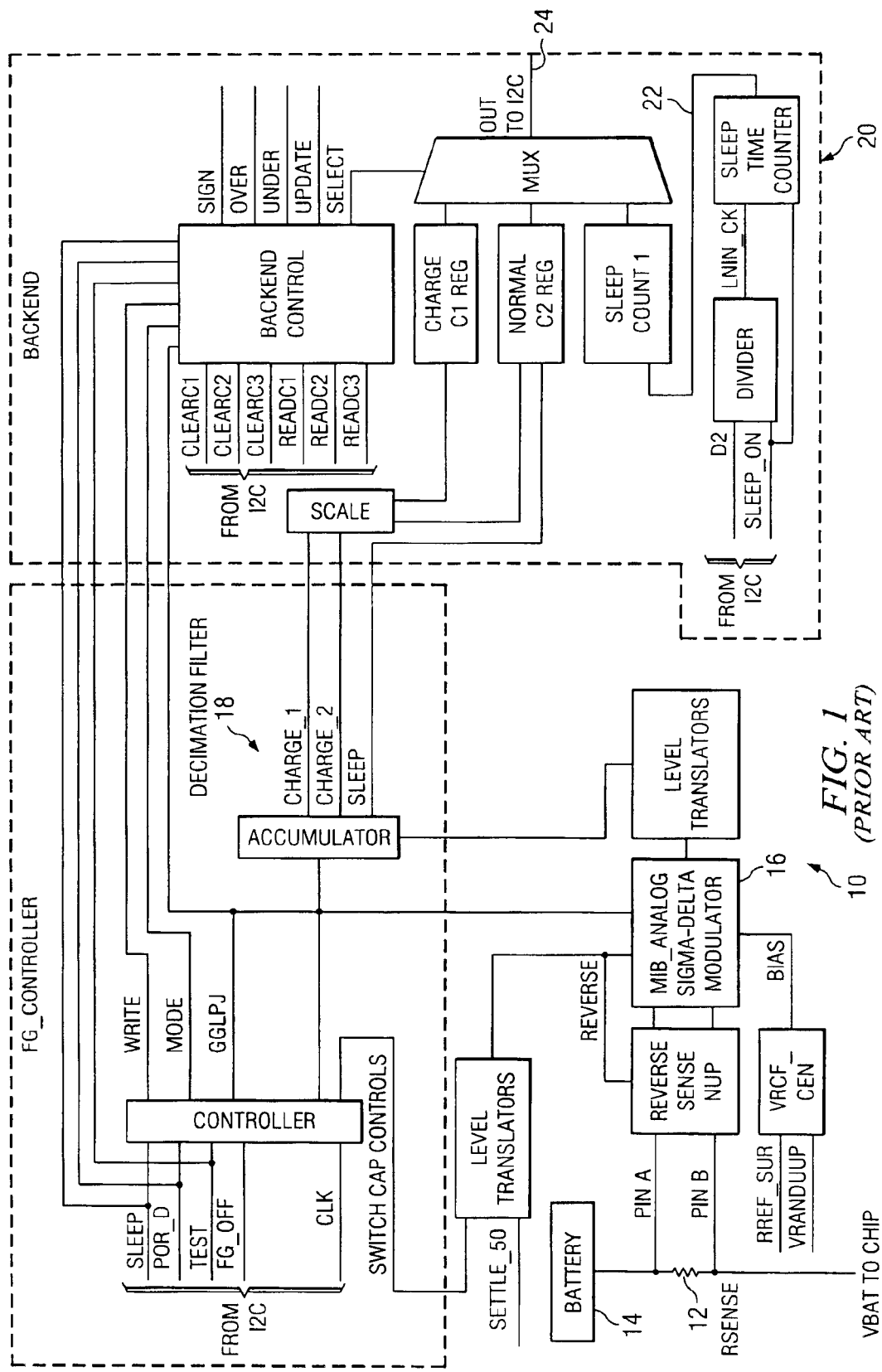
FIG. 1 is an example typifying a (prior art) circuit with which the invention may be used.

The use of a sigma-delta modulator in a DC measurement application such as the prior art example as shown in FIG. 1 is plagued by idle-tones or pattern noises from the input signal. When pattern noise is present, the accumulated value in the accumulator, or "decimation filter," cannot precisely represent the DC input $V_{in}$ to the modulator unless the reading at the accumulator is performed synchronously with the time period of the pattern noise cycle.

Using the invention, the fundamental frequency of the pattern noise can be accurately determined, and the bit-stream representing the analog input signal $V_{in}$ can be read at the optimum time. It has been determined that lowest pattern-noise frequency determines the fundamental pattern cycle. In general, the invention provides the novel approach of using the fundamental pattern cycle length, which has a one-to-one mapping relationship with the ratio of DC input $V_{in}$ to the reference voltage in a sigma-delta modulator loop, to ensure accuracy in measuring the DC input $V_{in}$.

Figure 2:
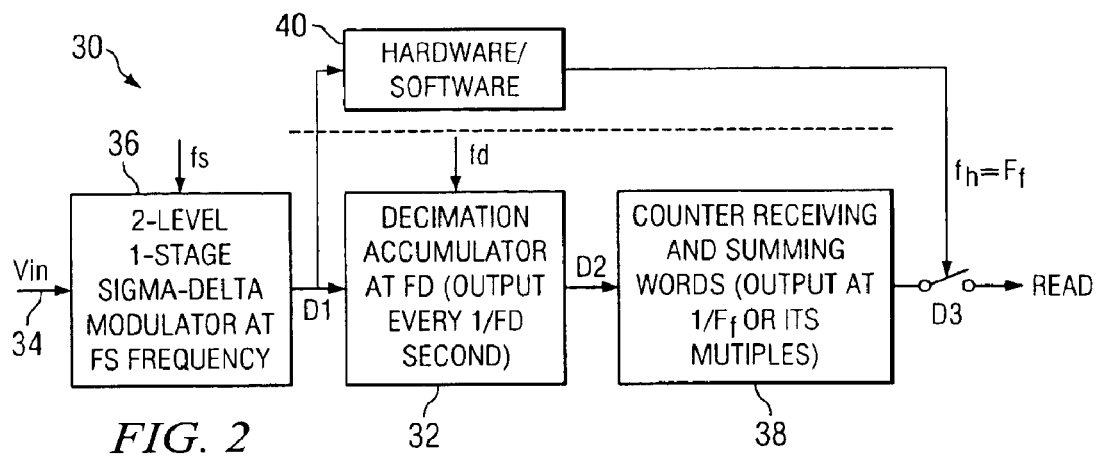
FIG. 2 is a block diagram of an exemplary embodiment of the invention.

A block diagram illustrating a DC measurement approach 30 according to the invention is shown in FIG. 2. Where $f_d$ represents the frequency at which the decimation filter 32 is read, in the conventional approach for DC measurement, frequency $f_d$ for outputting digital words from the accumulator is fixed. According to the invention, the reading frequency $f_h$ is an integer multiple of the fundamental pattern frequency, $F_f$, of the modulator output D1. The fundamental pattern frequency, $F_f$, is the lowest frequency in the pattern noise spectrum of the modulator output signal. It should be appreciated that a rational ratio $V_{in}/V_{ref}$ is solely determinative of the fundamental pattern frequency, $F_f$. The more decimal places, or higher resolution for $V_{in}/V_{ref}$, the smaller the $F_f$ value will be. Preferably, the input signal $V_{in}$ is obtained from the circuit to be measured (not shown) and is converted into a digital bitstream D1 by a two-level sigma-delta modulator 36. The modulator 36 operates at a given clock frequency $f_s$, such as $f_s$32.768 kHz to produce a digital (LRHF) bit-stream D1 from the analog input signal $V_{in}$. The LRHF digital word D1 is fed into a decimation accumulator 32 for conversion into a high-resolution low-frequency (HRLF) digital word D2. The HRLF word D2 is received by a counter 38 for summing and periodic outputting D3. A subcircuit 40 for making a determination of the fundamental pattern frequency $F_f$ of the input signal $V_{in}$ receives the LRHF word D1 from the modulator 36. The subcircuit 40 may be implemented using various forms of hardware and software familiar to those skilled in the arts without departure from the invention to determine the fundamental pattern frequency $F_f$ as further described herein.

Examples of preferred embodiments for implementing the subcircuit 40 in accordance with the invention include the use of DSP software or firmware, since D1 is a digital bit-stream and can be readily processed in DSP for FFT. As long as it is not too time consuming to calculate $F_f$, sharing an upper-level DSP with other jobs for this task would be a typical option available to those practicing the invention.

A further example is the implementation of the subcircuit 40 in a digital circuit, as long as it is capable of producing the fundamental pattern cycle information. Those skilled in the arts will recognize that a stand-alone FFT ASIC is commercially available, and that simple digital circuitry may be adapted for this purpose.

An example of a more manually operated, but effective implementation of the subcircuit 40 of the invention includes the use of ATE or other bench test equipment. An operator may visually observe a graphical representation of the output of the sigma-delta modulator, typically it may be read through a mux pin. Once an operator has identified the fundamental pattern length, he or she may manually set the fundamental pattern frequency $F_f$ to the observed value for further measurement according to the methods of the invention.

Figure 3:
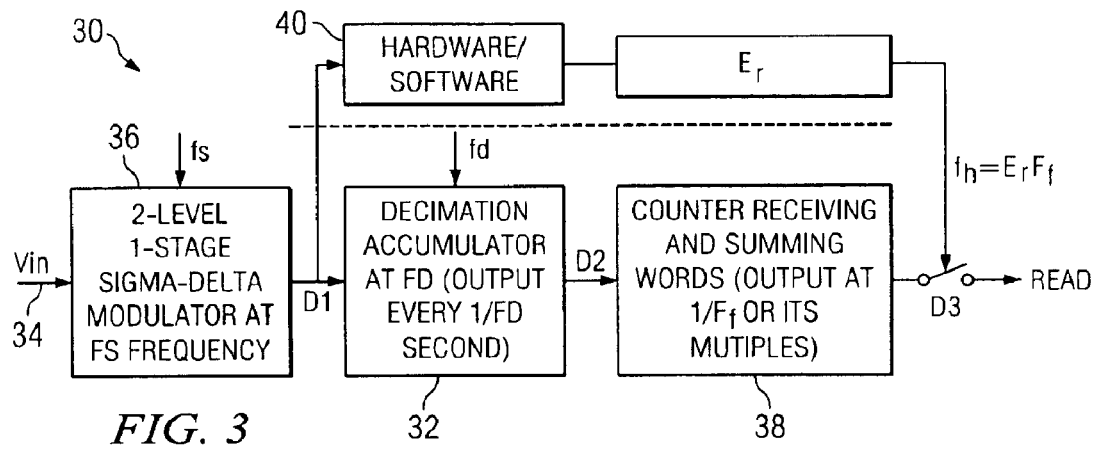
FIG. 3 is a block diagram showing an alternative representative embodiment of the invention.

An alternative preferred embodiment of the invention is described with reference primarily to FIG. 3. In this embodiment, a target relative error level, $E_r$, is selected and the methods and systems of the invention are adapted to ensure that measurements are made in such a way as to guarantee that the actual relative error is less than or equal to the target relative error $E_r$. In other words, the measured value for $V_{in}/V_{ref}$ is required to remain within a tolerated error level, $E_r$. Using the techniques of the invention, the number of fundamental pattern cycles $M_r$, and thus the measurement time required, is determined. Examination of Table 1 and the accompanying description should further assist in the understanding of the invention.

TABLE 1

$T_r$, $M_r$ vs $E_r$ ($f_s$ = 32.768 kHz and Max $N_p$ = 20)

| Target Relative Error $E_r$ | Pattern cycle Required, $M_r$ | Waiting Time Required $T_r$ (ms) |
|---|---|---|
| 1% | 100 | 61.04 |
| 2% | 50 | 30.52 |
| 3% | 34 | 20.35 |
| 4% | 25 | 15.26 |
| 5% | 20 | 12.21 |
| 6% | 17 | 10.17 |
| 7% | 15 | 8.72 |
| 8% | 13 | 7.63 |
| 9% | 12 | 6.78 |
| 10% | 10 | 6.10 |
| 11% | 10 | 5.55 |
| 12% | 9 | 5.09 |
| 13% | 8 | 4.70 |
| 14% | 8 | 4.36 |
| 15% | 7 | 4.07 |

Table 1 is an example of the implementation of the invention to measure DC voltage for a time period determined to provide accurate results. The number of pattern cycles meeting the $E_r$ requirement is represented by $M_r$. The results illustrated may be better understood with reference to the following derivation.

In actual measurement, there may be M cycles of patterns, plus a residue. Each pattern cycle contains $D_p$ net bits. The length of the residue in terms of number of bits is $\Delta D_{ref}$ and the number of net bits contained in residue is $\Delta D$:

$$E_r = \left| \frac{\frac{V_{in}}{V_{ref}} - \frac{\hat{V}_{in}}{\hat{V}_{ref}}}{\frac{V_{in}}{V_{ref}}} \right| \quad \text{(Eq. 1)}$$

$$= \left| \frac{\frac{D_p}{D_{ref}} - \frac{M*D_p + \Delta D}{M*D_{ref} + \Delta D_{ref}}}{\frac{D_p}{D_{ref}}} \right| =$$

$$\left| \frac{\frac{D_p}{D_{ref}} - \frac{D_p + \frac{\Delta D}{M}}{D_{ref} + \frac{\Delta D_{ref}}{M}}}{\frac{D_p}{D_{ref}}} \right| < \left| \frac{\frac{D_p}{D_{ref}} - \frac{D_p + \frac{\Delta D}{M}}{D_{ref}}}{\frac{D_p}{D_{ref}}} \right| \le$$

$$\left| \frac{\frac{D_p}{D_{ref}} - \frac{D_p + \frac{\Delta D_{ref}}{M}}{D_{ref}}}{\frac{D_p}{D_{ref}}} \right| \le \left| \frac{\frac{D_p}{D_{ref}} - \frac{D_p + \frac{\max \Delta D_{ref}}{M}}{D_{ref}}}{\frac{D_p}{D_{ref}}} \right| =$$

$$\left| \frac{-\frac{\max \Delta D_{ref}}{M}}{\frac{D_p}{D_{ref}}} \right|.$$

The specification of a relative error requirement of $E_r$ means that the absolute net-bit error cannot go beyond $E_a$. Thus, the relationship between $E_a$ and $E_r$ may be expressed:

$$E_r = \frac{\frac{E_a}{N_p}}{\frac{V_{in}}{V_{ref}}} = \frac{\frac{E_a}{D_{ref}}}{\frac{D_p}{D_{ref}}} = \frac{\frac{E_a}{D_{ref}}}{\frac{D_p}{D_{ref}}}. \quad \text{(Eq. 2)}$$

Comparing the above two formulas, gives:

$$\frac{E_a}{D_{ref}} < \frac{\frac{\max \Delta D_{ref}}{M}}{D_{ref}}, \quad \text{(Eq. 3)}$$

or, $$E_a < \frac{\max \Delta D_{ref}}{M}. \quad \text{(Eq. 4)}$$

Also, from equation 2:

$$E_a = D_p E_r,$$

(Eq. 5) so, $$E_a = D_p E_r < \frac{\max \Delta D_{ref}}{M}. \quad \text{(Eq. 6)}$$

However, $$E_a = D_p E_r \le (N_p - 1) E_r$$

(Eq. 7) This equation shows that, given the relative error $E_r$, the upper limit for the absolute error is $(N_p-1)E_r$. Note that $E_a$ may only reach this maximum value, while equation 6 indicates that the absolute error can never reach the value of $$\frac{\max \Delta D_{ref}}{M}$$

(from Eq. 5). Therefore, selecting a particular M value, herein denoted $M_r$, so that, $$\frac{\max \Delta D_{ref}}{M_r} \le (N_p - 1) E_r, \quad \text{(Eq. 8)}$$

the relative error will be guaranteed to be within the selected limit. The minimum number of pattern cycles and waiting time for a given relative current error $E_r$ are therefore:

$$M_r \ge \frac{1}{E_r} \quad \text{(Eq. 9, and Eq. 10 respectively)}$$

$$T_r = M_r(\max T_p) = \frac{1}{E_r} \frac{\max N_p}{f_s}.$$

As illustrated in Table 1, with an exemplary case of Max $N_p$=20, or a resolution of 0.1 (i.e., $V_{in}/V_{ref}$'s value space is 0.0, 0.1, 0.2, . . . , 0.9, 1.0), the implementation of the above-described operations give pattern cycle and measurement times ensuring a given selected relative error level $E_r$.

For the purposes of illustrating the principles and application of the invention, it may be beneficial to consider the following examples demonstrating the use of the invention for selected relative error, $E_r$, levels of $E_r=15\%$, 10% and 5% by simulation. Referring to Table 1, to make the relative error meet the target $E_r=15\%$, it can be seen that a waiting time of at least $M_r=7$ pattern cycles is required. Also referring to Table 1, it can be seen that 10 or 20 pattern cycles are required to meet the requirement of $E_r=10\%$, and $E_r=5\%$ respectively. Testing the cases for each of the $V_{in}/V_{ref}$ values in Table 1, with the accumulation length:

$$N=Mr(\text{Max}Np)+\text{residue}$$

(Eq. 11), where Residue=1, 2, 3, . . . , 19 covering all the possible residue values. "Actual $E_r$" in the Tables is calculated by, $$\text{Actual } Er = \frac{\left(\frac{V_{in}}{V_{ref}}\right) - \frac{\text{Accumulated\_Net\_Bits}}{\text{Accumulated\_Total\_Clocks}}}{\left(\frac{V_{in}}{V_{ref}}\right)}. \quad (\text{Eq. 12})$$

Table 2 depicts the simulation result. It can be seen that the actual errors are less than the target $E_r$.

TABLE 2

Simulation Result for Checking $E_r$ at Resolution = 0.1
Accumulation length N = $M_r$ * $N_p$ + Residue
(fs = 32.768 kHz and Max $N_p$ = 20, Residue = 1, 2, 3, . . . , 19 clocks)

| Spec $E_r$ | Required $M_r$ | Actual Max $E_r$ | $V_{in}/V_{ref}$ = 0.1 | 0.2 | 0.3 | 0.4 | 0.5 | 0.6 | 0.7 | 0.8 | 0.9 |
|---|---|---|---|---|---|---|---|---|---|---|---|
| 15% | 7 | 11.56% | 11.56% | −11.11% | −3.4% | −4.43% | 6.67% | 5.41% | −1.48% | −2.85% | −1.33% |
| 10% | 10 | 8.21% | 8.21% | −7.84% | −2.44% | −3.21% | 4.76% | 3.85% | −1.05% | −2.06% | −0.96% |
| 5% | 20 | 4.18% | 4.18% | −3.96% | −1.23% | −1.67% | 2.44% | 1.96% | −0.53% | −1.08% | −0.50% |

Figure 4:
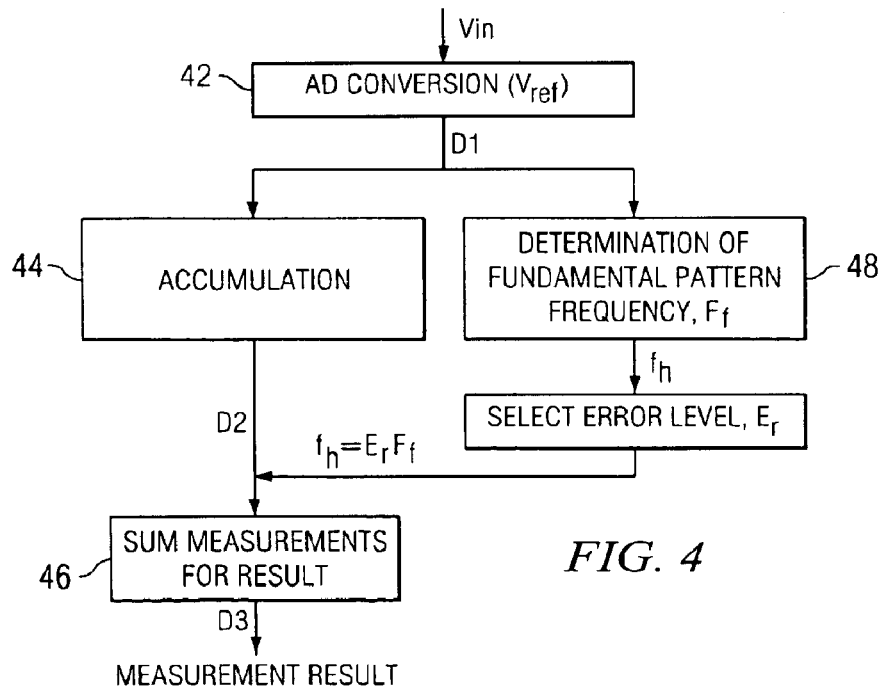
FIG. 4 is a process flow diagram illustrating an embodiment of the invention.

FIG. 4 is a process flow diagram providing an alternative view of a preferred embodiment of the steps of invention in which the analog DC input signal $V_{in}$ is converted 42 into a digital form D1. The digitized signal D1 is accumulated 44 and the accumulated signal D2 is summed, at step 46, for periodic output. Also, shown in step 48, the fundamental pattern frequency $F_f$ of the input signal Vin is determined from digital bitstream D1. Preferably, at step 50, an acceptable relative error level $E_r$ is selected according to application requirements and the periodic output of measurement results D3 is controlled at step 48 such that the selected relative error level $E_r$ is not exceeded.

Thus, the invention provides the ability to ensure the measurement accuracy of sigma-delta modulator in DC applications. The invention may be readily applied to battery fuel gauges in portable electronic devices such as mobile telephones. While the invention has been described with reference to certain illustrative embodiments, the description of the methods and devices described are not intended to be construed in a limiting sense. Various modifications and combinations of the illustrative embodiments as well as other advantages and embodiments of the invention will be apparent to persons skilled in the art upon reference to the description and claims.

I claim:

1. A method of measuring DC voltage in a circuit comprising the steps of:

converting the DC voltage into a digital bitstream and periodically rendering low-resolution high frequency words therefrom;

accumulating the low-resolution high-frequency words and periodically rendering high-resolution low frequency words therefrom;

determining a fundamental pattern noise frequency from the DC voltage;

summing the high-resolution low-frequency words and periodically outputting, at a frequency equal to an integer multiple of the fundamental pattern noise frequency, a DC voltage measurement result.

2. A method according to claim 1 wherein the integer multiple of the fundamental pattern noise frequency is no less than 7.

3. A method according to claim 1 wherein the integer multiple of the fundamental pattern noise frequency is no less than 10.

4. A method according to claim 1 wherein the integer multiple of the fundamental pattern noise frequency is no less than 20.

5. A method according to claim 1 wherein the step of determining the fundamental pattern noise frequency further comprises the steps of:

selecting a relative error level, $E_r$; and
selecting a number of pattern cycles, $M_r$, such that:

$$M_r \geq \frac{1}{E_r}. \quad (\text{Eq. 9})$$

6. A method according to claim 1 wherein the step of determining the fundamental pattern noise frequency further comprises the steps of:

selecting a relative error level, $E_r$ such that the waiting time for measurement is at least:

$$T_r = M_r(\text{max}T_p) = \frac{1}{E_r}\frac{\text{max}N_p}{f_s}. \quad (\text{Eq. 10})$$

7. A system for measuring given DC voltage in a circuit comprising:

a sigma-delta modulator for converting the DC voltage into a digital bitstream and periodically rendering low-resolution high-frequency words therefrom;

an accumulator for accumulating the low-resolution high-frequency words and periodically rendering high-resolution low-frequency words therefrom;

a subcircuit for determining a fundamental pattern noise frequency corresponding to the DC voltage;

a counter for summing the high-resolution low-frequency words and periodically outputting, at a time cycle equal to an integer multiple of the fundamental pattern noise cycle, a DC voltage measurement result.

8. The system of claim 7 wherein the subcircuit for determining a fundamental pattern noise frequency at given DC voltage further comprises a DSP device.

9. The system of claim 7 wherein the subcircuit for determining a fundamental pattern noise frequency of the DC voltage further comprises an ASIC device.

10. The system of claim 7 wherein the subcircuit for determining a fundamental pattern noise frequency at the given DC voltage further comprises automatic test equipment.

11. The system of claim 7 wherein the DC voltage measurement result is representative of battery condition of an electronic device.

12. The system of claim 7 further comprising a sense resistor for deriving the DC voltage from a DC current.

13. An algorithm for measuring DC voltage in a circuit comprising machine-readable instructions for executing the steps of:
converting the DC voltage into a digital bitstream and rendering high-resolution low frequency words therefrom;
determining a fundamental pattern noise frequency of the DC voltage;
periodically outputting, at a frequency equal to an integer multiple of the fundamental pattern noise frequency, a DC voltage measurement result.

14. An algorithm according to claim 13 wherein the step of determining the fundamental pattern noise frequency further comprises the steps of:
selecting a relative error level, Er; and
selecting a number of pattern cycles, Mr, such that:

$$M_r \geq \frac{1}{E_r}. \quad \text{(Eq. 9)}$$

15. An algorithm according to claim 13 wherein the waiting period of time is described by the equation:

$$T_r = M_r(\max T_p) = \frac{1}{E_r} \frac{\max N_p}{f_s}. \quad \text{(Eq. 10)}$$

16. An algorithm according to claim 13 wherein the integer multiple of the fundamental pattern noise frequency is no less than 7.

17. An algorithm according to claim 13 wherein the integer multiple of the fundamental pattern noise frequency is no less than 10.

18. An algorithm according to claim 13 wherein the integer multiple of the fundamental pattern noise frequency is no less than 20.

19. An algorithm according to claim 13 further comprising the step of deriving the DC voltage from a DC current source.

* * * * *